(12) United States Patent
Matsumura et al.

(10) Patent No.: US 7,703,657 B2
(45) Date of Patent: Apr. 27, 2010

(54) DEVICE FOR MOUNTING ELECTRIC COMPONENT

(75) Inventors: Takashi Matsumura, Tochigi (JP); Hisashi Ando, Tochigi (JP); Shiyuki Kanisawa, Tochigi (JP); Yasuhiro Suga, Tochigi (JP); Noriaki Kudo, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 12/466,977

(22) Filed: May 15, 2009

(65) Prior Publication Data
US 2009/0230171 A1 Sep. 17, 2009

Related U.S. Application Data

(63) Continuation of application No. 11/327,784, filed on Jan. 6, 2006, now Pat. No. 7,556,190, which is a continuation of application No. PCT/JP2004/009726, filed on Jul. 8, 2004.

(30) Foreign Application Priority Data
Jul. 11, 2003 (JP) ............................. 2003-195684

(51) Int. Cl.
*B23K 37/00* (2006.01)
(52) U.S. Cl. ............................. 228/5.5; 228/6.2; 228/19
(58) Field of Classification Search ....................... None
See application file for complete search history.

(56) References Cited

FOREIGN PATENT DOCUMENTS

JP 2003-261769 A * 9/2003

* cited by examiner

*Primary Examiner*—Kiley Stoner
(74) *Attorney, Agent, or Firm*—K&L Gates LLP

(57) ABSTRACT

A mounting method and a mounting device are provided, which can mount an electric component with high reliability by using an adhesive. The mounting method includes thermocompression bonding an IC chip onto a wiring board by using an anisotropic conductive adhesive film. During the thermocompression bonding, a top region of the IC chip is pressed against the wiring board with a predetermined pressure, and a side region of the IC chip is pressed with a pressure smaller than the pressure applied to the top region of the IC chip. An elastomer having rubber hardness of 40 or more and 80 or less is used for a compression bonding portion of a thermocompression bonding head. The anistropic conductive adhesive film contains a binding resin having melting viscosity of $1.0\times10^2$ mPa·s or more and $1.0\times10^5$ mPa·s or less.

14 Claims, 2 Drawing Sheets

DEVICE FOR MOUNTING ELECTRIC COMPONENT

CROSS REFERENCE TO RELATED APPLICATIONS

The present application is a continuation of U.S. application Ser. No. 11/327,784, filed on Jan. 6, 2006, now U.S. Pat No. 7,556,190 which is a continuation of International Application No. PCT/JP2004/009726, filed on Jul. 8, 2004, and claims priority to Japanese Patent Application No. 2003-195684 filed in the Japanese Patent Office on Jul. 11, 2003, the entire contents of which are being incorporated herein by reference.

BACKGROUND

The present invention relates to a technology for mounting an electric component such as a semiconductor chip on a wiring board. More particularly, the present invention relates to a technology for mounting an electric component by using an adhesive.

In order to directly mount a bare chip on a wiring board such as a printed wiring board, a method is conventionally known which uses an anisotropic conductive adhesive film in which conductive particles are dispersed in a binder.

In the mounting method using the anisotropic conductive adhesive film, an IC chip is placed on a substrate with the anisotropic conductive adhesive film bonded thereto, and then the IC chip is pressed and heated with a flat bonding head formed of ceramic, metal, or the like, so as to cure the anisotropic conductive adhesive film. In this manner, mounting by thermocompression bonding is performed.

In the method using the bonding head formed of metal or the like for pressurization and heating, there is a problem that a heat applied to a fillet portion of the adhesive around the IC chip is insufficient during thermocompression bonding, thus lowering connection reliability. Moreover, there is also a problem that it is difficult to mount a plurality of IC chips.

Therefore, a technique has been proposed in recent years in order to overcome the above problems, in which thermocompression bonding of an IC chip is performed by using a thermocompression bonding head formed of an elastic material such as silicon rubber.

See, Japanese Patent Laid-Open Publication No. 2000-79611; and Japanese Patent Laid-Open Publication No. 2002-359264.

However, in the aforementioned conventional technique, a pressing force applied between a bump and a pattern which connect the IC chip and the substrate to each other is not sufficient. Thus, sufficient connection is not performed and it is not possible to ensure initial conduction resistance and connection reliability after aging.

SUMMARY

It is therefore desirable to provide a mounting method and a mounting device, which can mount an electric component with high reliability by using an adhesive.

In an embodiment, the present invention provides a method for mounting an electric component that includes thermocompression bonding an electric component onto a wiring board by using an adhesive, wherein during the thermocompression bonding, a top region of the electric component is pressed against the wiring board with a predetermined pressure, and a side region of the electric component is pressed with a pressure smaller than the pressure applied to the top region.

As used herein, the term "side region" of the "electric component" refers not only to a side of the electric component such as an IC chip but also to a region around the electric component, such as a portion of the adhesive around the electric component.

In an embodiment of the present invention, the electric component is heated at a predetermined temperature and heat the wiring board at a temperature higher than the predetermined temperature during the thermocompression bonding.

In an embodiment of the present invention, a compression bonding portion formed of a predetermined elastomer against a top and a side of the electric component.

In an embodiment of the present invention, an elastomer is used that has rubber hardness of 40 or more and 80 or less for the compression bonding portion for the thermocompression bonding.

In an embodiment of the present invention, the adhesive is heated to achieve melting viscosity of $1.0 \times 10^2$ mPa·s or more and $1.0 \times 10^5$ mPa·s or less during the thermocompression bonding.

In an embodiment of the present invention, an anisotropic conductive adhesive film is used in which conductive particles are dispersed in a binding resin as the adhesive.

In an embodiment of the present invention, the top region and the side region of the electric component are simultaneously pressed.

Moreover, the present invention provides in an embodiment a mounting device including a thermocompression bonding head having a compression bonding portion formed of an elastomer having rubber hardness of 40 or more and 80 or less. The mounting device is arranged to press the compression bonding portion against an electric component placed on a wiring board with a predetermined pressure.

In an embodiment of the present invention, a thickness of the compression bonding portion of the thermocompression bonding head is equal to or larger than a thickness of the electric component.

In an embodiment of the present invention, a size of the compression bonding portion of the thermocompression bonding head is larger than an area of the electric component.

In an embodiment of the present invention, a size of the compression bonding portion of the thermocompression bonding head is larger than an area of a region where a plurality of electric components are arranged.

In an embodiment of the present invention, a base for supporting the wiring board is provided, wherein the base includes a heater.

According to the method of the present invention in an embodiment, during thermocompression bonding, a top region of an electric component is pressed against a wiring board with a predetermined pressure, while a side region of the electric component is pressed with a pressure smaller than the pressure applied to the top region. Thus, a sufficient pressure can be applied to a portion at which the electric component and the wiring board are connected to each other, and a fillet portion around the electric component can be pressurized without generating a void. Therefore, it is possible to connect an IC chip or the like with high reliability by using an anisotropic conductive adhesive film, for example.

According to an embodiment of the present invention, during the thermocompression bonding, an electric component is heated at a predetermined temperature, and a wiring board is heated at a temperature higher than the predetermined temperature by means of a heater that is provided in a supporting base, for example. In this manner, it is possible to sufficiently heat the fillet portion around the electric component. Therefore, generation of a void can be further prevented.

Moreover, according to an embodiment of the present invention, it is possible to easily apply pressures to the top region and the side region of the electric component with a predetermined pressure difference maintained between those pressures by pressing the compression bonding portion formed of a predetermined elastomer against the top and the side of the electric component.

In addition, when an elastomer having rubber hardness of 40 or more and 80 or less is used for the compression bonding portion, it is possible to apply optimum pressures to the top region and the side region of the electric component. Moreover, when the adhesive is heated during the thermocompression bonding so as to achieve melting viscosity of $1.0 \times 10^2$ mPa·s or more and $1.0 \times 10^5$ mPa·s or less, it is possible to remove a binding resin from the connecting portion and prevent generation of a void during the thermocompression bonding more surely. Therefore, connection with higher reliability can be achieved.

According to an embodiment of the present invention, a mounting device includes a thermocompression bonding head having a compression bonding portion formed of an elastomer having rubber hardness of 40 or more and 80 or less and is arranged to press the compression bonding portion against an electric component placed on a wiring board with a predetermined pressure. Therefore, the mounting device that can perform highly reliable connection and has a simple configuration can be obtained.

In the present invention in an embodiment, in the case where the thickness of the compression bonding portion of the thermocompression bonding head is equal to or larger than that of the electric component or in the case where the size of the compression bonding portion of the thermocompression bonding head is larger than that of the electric component, it is possible to apply optimum pressures to a top region and a side region of the electric component more surely.

Moreover, in the present invention in an embodiment, in the case where the size of the compression bonding portion of the thermocompression bonding head is larger than an area of a region where a plurality of electric components are arranged, it is possible to connect those electric components with high reliability at the same time. Therefore, mounting efficiency can be largely improved.

According to the present invention in an embodiment, it is possible to mount an electric component with high reliability by using adhesive.

Additional features and advantages are described herein, and will be apparent from, the following Detailed Description and the figures.

DETAILED DESCRIPTION

Embodiments of a method and a device for mounting an electric component according to the present invention are now described with reference to the drawings.

Figure 1:
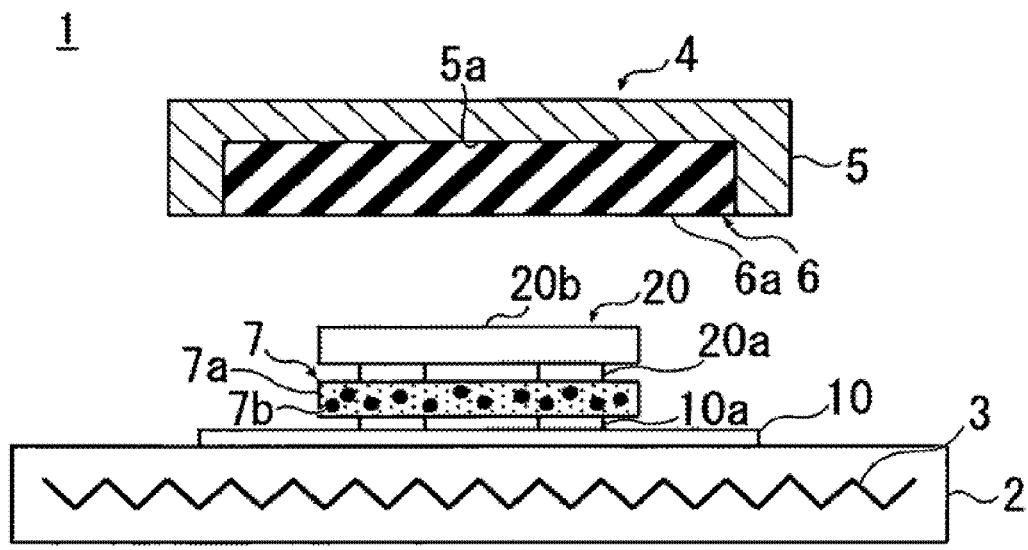
FIG. 1 is a schematic diagram showing the configuration of a main part of an embodiment of a mounting device and a thermocompression bonding process according to the present invention.
Figure 2:
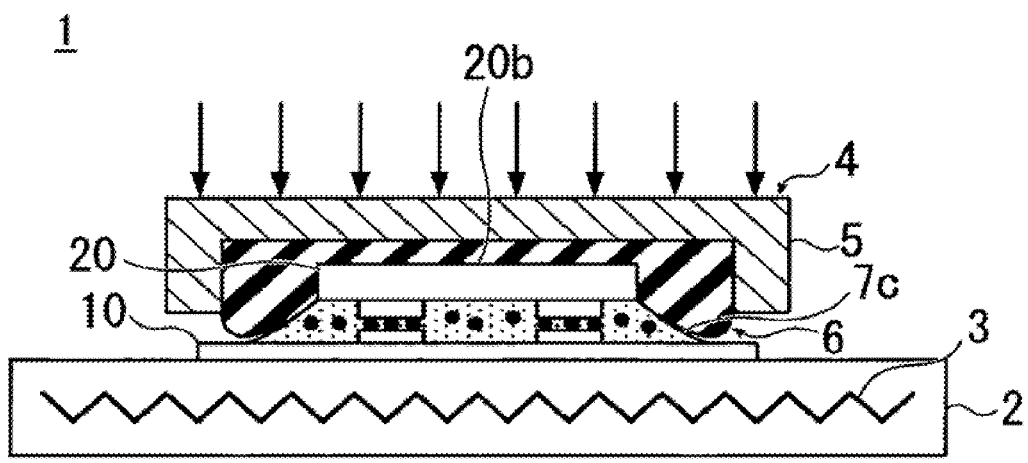
FIG. 2 is a schematic diagram showing the configuration of a main part of an embodiment of a mounting device and a thermocompression bonding process according to the present invention.

FIGS. 1 and 2 generally show a main part of a mounting device and a thermocompression bonding process in the present embodiment.

As shown in FIG. 1, the mounting device 1 of the present embodiment includes a base 2 on which a wiring board 10 with a wiring pattern 10a formed thereon is placed and a thermocompression bonding head 4 for pressing and heating an IC chip (electric component) 20 provided with a protrusion 20a.

The base 2 is formed of a predetermined metal. A heater 3 is provided inside the base 2.

The thermocompression bonding head 4 has a head body 5 formed of a predetermined metal and a heater (not shown) provided therein.

A concave portion 5a is formed in a portion of the head body 5 that is opposed to the base 2. A compression bonding portion 6 formed of an elastomer in the form of a plate is attached to the concave portion 5a so as to be in close contact with the concave portion 5a.

The compression bonding portion 6 of the present embodiment is arranged in such a manner that its compression bonding face 6a is arranged horizontally. The compression bonding face 6a of the compression bonding portion 6 is formed to have a larger area than a top 20b of the IC chip 20.

The compression bonding portion 6 has a thickness that is equal to or larger than that of the IC chip 20.

In the present invention in an embodiment, the type of the elastomer forming the compression bonding portion 6 is not specifically limited. However it is preferable to use an elastomer having rubber hardness of 40 or more and 80 or less from a viewpoint of improving connection reliability.

An elastomer having rubber hardness that is less than 40 has a disadvantage that a pressure applied to the IC chip 20 is insufficient and initial conduction resistance and connection reliability are not good. Moreover, an elastomer having rubber hardness that is larger than 80 has a disadvantage that a pressure applied to a fillet portion is insufficient and a void is generated in a binding resin of adhesives thus lowering connection reliability.

As described herein a standard conforming to JIS S 6050 is applied to rubber hardness.

It is preferable to use any of natural rubber and synthetic rubber as the above elastomer. From a viewpoint of heat resistance and pressure resistance, silicone rubber is preferably used.

In order to mount the IC chip 20 in the present embodiment having the aforementioned configuration, the wiring board 10 is arranged on the base 2 and an anisotropic conductive adhesive film 7 is placed on the wiring board 10, as shown in FIG. 1.

The anisotropic conductive adhesive film 7 includes a binding resin 7a and conductive particles 7b dispersed in the binding resin 7a.

Melting viscosity of the binding resin 7a as adhesive of the present invention is not affected by whether or not the conductive particles 7b are dispersed in the binding resin 7a, if the amount of the conductive particles 7b in the binding resin 7a is small.

The IC chip 20 is placed on the above anisotropic conductive adhesive film 7. Then, the compression bonding face 6a of the thermocompression bonding head 4 is pressed against the top 20b of the IC chip 20 via a protection film (not shown)

so as to perform preliminary compression bonding under a predetermined condition. Main compression bonding is then performed under the following condition.

In the present invention in an embodiment, during the main compression bonding, the IC chip 20 is heated at a predetermined temperature and the wiring board 10 is heated at a temperature higher than the predetermined temperature.

More specifically, the heater of the thermocompression bonding head 4 is controlled so as to adjust a temperature of the compression bonding portion 6 to about 100° C. and the heater 3 of the base 2 is controlled to adjust a temperature of the binding resin 7a of the anisotropic conductive adhesive film 7 to about 200° C. which is the temperature of the compression bonding portion 6.

In this manner, the anisotropic conductive adhesive film 7 is heated to achieve melting viscosity of $1.0 \times 10^2$ mPa·s or more and $1.0 \times 10^5$ mPa·s or less during the thermocompression bonding.

In the case where the melting viscosity of the anisotropic conductive adhesive film 7 is less than $1.0 \times 10^2$ mPa·s during thermocompression bonding, there is a disadvantage that fluidity, of the binding resin 7a during the thermocompression bonding is large and a void is generated. Thus, initial conduction resistance and connection reliability are not good. In the case where the melting viscosity of the anisotropic conductive adhesive film 7 is larger than $1.0 \times 10^5$ mPa·s, the binding resin 7a cannot be completely removed from a connecting portion during the thermocompression bonding and a void is generated. Therefore, initial conduction resistance and connection reliability are not good.

During the main compression bonding, a pressure of about 100 N is applied for each IC chip for about 15 seconds.

As shown in FIG. 2, in the present embodiment, pressurization is performed by means of the compression bonding portion 6 formed of an elastomer having rubber hardness of 40 or more and 80 or less, thereby pressing the top 20b of the IC chip 20 against the wiring board 10 with a predetermined pressure and pressing the fillet portion 7c at the side of the IC chip 20 with a pressure smaller than that applied to the top 20b. Thus, it is possible to apply a sufficient pressure to the connecting portion at which the IC chip 20 and the wiring board 10 are connected to each other. It is also possible to apply a pressure to the fillet portion 7c around the IC chip 20 without generating a void.

As a result, it is possible to connect the IC chip 20 or the like with high reliability by using the anisotropic conductive adhesive film 7 according to the present embodiment.

During the thermocompression bonding, the IC chip 20 is heated at a predetermined temperature and the wiring board 10 is heated at a temperature higher than the predetermined temperature. In this manner, the fillet portion 7c around the IC chip 20 can be sufficiently heated and generation of a void can be surely prevented.

Moreover, the anisotropic conductive adhesive film 7 is heated so as to achieve melting viscosity of $1.0 \times 10^2$ mPa·s or more and $1.0 \times 10^5$ mPa·s or less during the thermocompression bonding. Thus, it is possible to remove the binding resin 7a from the connecting portion and prevent generation of a void during the thermocompression bonding more surely. Therefore, connection with higher reliability can be performed.

In addition, according to the mounting device 1 of the present embodiment a mounting device having a simple configuration that can perform highly reliable connection can be obtained.

Especially, according to the present embodiment, the thickness or the compression bonding portion 6 is equal to or larger than that of the IC chip 20. Thus, it is possible to surely apply optimum pressures to the top 20b of the IC chip 20 and the fillet portion 7c at the side of the IC chip 20, respectively.

Figure 3:
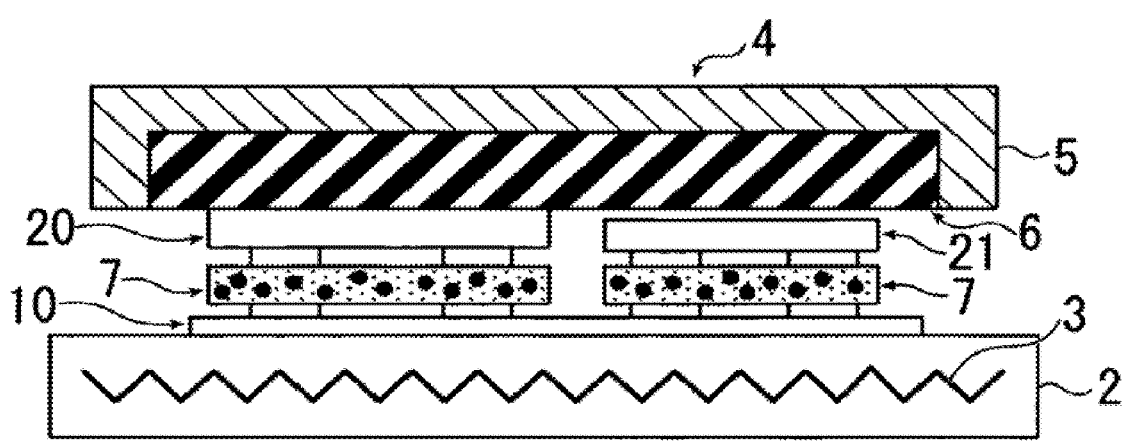
FIG. 3 is a schematic diagram showing the configuration of another embodiment of the present invention.

FIG. 3 is a schematic view showing the configuration according to another embodiment of the present invention. Parts corresponding to those in the above embodiment are labeled with the same reference numerals and the detailed description thereof is omitted.

As shown in FIG. 3, a mounting device 1A of the present embodiment is different from that of the above embodiment in that a size of the compression bonding portion 6 is set to be larger than an area of a region where a plurality of (e.g., two) IC chips 20 and 21 having different sizes from each other, for example, are arranged.

In this case, the rubber hardness of the compression bonding portion 6 is 40 or more and 80 or less, that is, is the same as that in the above embodiment.

According to the present embodiment having the above configuration, it is possible to simultaneously perform connection of a plurality of IC chips 20 and 21 with high reliability especially in the case where the IC chips 20 and 21 are different from each other in thickness. Thus, mounting efficiency can be largely improved. Except for the above, the configuration, operation, and effects of the present embodiment are the same as those of the above embodiment. Therefore, the detailed description of the configuration, operation, and effects of the present embodiment is omitted.

The present invention is not limited to the aforementioned embodiments but can be modified in various ways.

For example, a case is described in the aforementioned embodiments, in which the IC chip is mounted by using the anisotropic conductive adhesive film. However, the present invention is not limited thereto. Alternatively, an adhesive containing no conductive particle may be used.

Moreover, a case is described in the aforementioned embodiments, in which the IC chip including a bump electrode is mounted. However, the present invention can also be applied to an IC chip having no bump electrode.

EXAMPLES

Examples illustrative of the present invention are now described in detail together with Comparative Examples.

Example 1

A rigid substrate fabricated by forming a Cu pattern having a width of 75 μm and a pitch of 150 μm on a glass epoxy substrate and forming nickel/gold plating on that substrate as used as a wiring board. A chip having a size of 6×6 mm and a thickness of 0.4 mm, in which bump electrodes were formed at a pitch of 150 μm, was prepared as an IC chip.

The IC chip was bonded onto the wiring board by thermocompression bonding by using a thermocompression bonding head provided with a compression bonding portion which had a size of 60×60 mm and a thickness of 10 mm and was formed of silicon rubber having rubber hardness of 40. As an anisotropic conductive adhesive film, a film formed by dispersing conductive particles in a binding resin having melting viscosity of $1.0 \times 10^5$ mPa·s was used.

In this case, pressurization and heating were performed with a pressure of 100 N/IC (278 N/cm²) for 15 seconds, while a temperature of a base was controlled to adjust a temperature of the compression bonding portion to 100° C. and a temperature of the anisotropic conductive adhesive film to 200° C.

Example 2

Except that the compression bonding portion formed of silicone rubber having rubber hardness of 80 was used, thermocompression bonding was performed under the same condition as that in Example 1.

Comparative Example 1

Except that the compression bonding portion formed of silicone rubber having rubber hardness of 10 or less was used, thermocompression bonding was performed under the same condition as that in Example 1.

Comparative Example 2

Except that the compression bonding portion formed of silicone rubber having rubber hardness of 120 was used, thermocompression bonding was performed under the same condition as that in Example 1.

Example 3

Except that an anisotropic conductive adhesive film in which conductive particles were dispersed in a binding resin having melting viscosity of $1.0 \times 10^2$ mPa·s was used, thermocompression bonding was performed under the same condition as that in Example 1.

Comparative Example 3

Except that an anisotropic conductive adhesive film in which conductive particles were dispersed in a binding resin having melting viscosity of 5 mPa·s was used, thermocompression bonding was performed under the same condition as that in Example 1.

Comparative Example 4

Except that an anisotropic conductive adhesive film in which conductive particles were dispersed in a binding resin having melting viscosity of $1.0 \times 10^9$ mPa·s was used, thermocompression bonding was performed under the same condition as that in Example 1.

Comparative Example 5

Except that the compression bonding portion formed of silicone rubber to have thickness (here, 0.2 mm) thinner than the IC chip was used, thermocompression bonding was performed under the same condition as that in Example 1.

Reliability Evaluation

Reliability depending on the rubber hardness of the compression bonding portion and that depending on the melting viscosity of the binding resin were evaluated for the above Examples and Comparative Examples. Tables 1 and 2 show the results.

[Table 1]

TABLE 1

Evaluation of reliability depending on rubber hardness of compression bonding portion

|  | Comparative Example 1 | Example 1 | Example 2 | Comparative Example 2 |
|---|---|---|---|---|
| Rubber hardness | 10 or less | 40 | 80 | 120 |
| Void | None | None | None | Generated |
| Initial conduction resistance | X | ○ | ○ | ○ |
| Connection reliability | X | ○ | ○ | X |

(Note)
Melting viscosity of resin = $1.0 \times 10^5$ mPa·S

[Table 2]

TABLE 2

Evaluation of reliability depending on melting viscosity of binding resin

|  | Comparative Example 3 | Example 3 | Example 1 | Comparative Example 4 |
|---|---|---|---|---|
| Melting Viscosity of resin (mPa·S) | 5 | $1.0 \times 10^2$ | $1.0 \times 10^5$ | $1.0 \times 10^9$ |
| Void | None | None | None | Generated |
| Initial conduction resistance | X | ○ | ○ | ○ |
| Connection reliability | X | ○ | ○ | X |

(Note)
Rubber hardness = 40

For the initial conduction resistance, a resistance value between patterns was measured by four-terminal method. An example or comparative example for which the measured resistance value was less than 1 Ω was represented with ○. An example or comparative example for which the measured resistance value was 1 Ω or more was represented with x.

For the connection reliability, a resistance value was measured and evaluated, after aging was performed at a temperature of 85° C. and a relative humidity of 85% for 24 hours and then a reflow process having a predetermined profile was performed as follows: temperature increase at a rate of 1° C./S to 4° C./S→after heat at a temperature of 150° C.±10° C. for 30 s±1 s→temperature increase at a rate of 1° C./S to 4° C./S→soldering at a peak temperature of 235° C.±5° C. for 10 s±1 s→cooling at a rate of 1° C./S to 4° C./S. An example or comparative example for which the measured resistance value was less than 1 Ω was represented with ○, while an example or comparative example for which the measured resistance value was 1 Ω or more was represented with x.

Generation of a void was evaluated with an ultrasonic microscope. An example or comparative example for which no void was generated was represented with ○, while an example or comparative example for which a void was generated was represented with x.

As shown in Table 1, Example 1 in which the rubber hardness of the compression bonding portion was 40 and Example 2 in which the rubber hardness of the compression bonding portion was 80 were good in both the initial conduction resistance and the connection reliability. No void was generated in Examples 1 and 2.

On the other hand, in Comparative Example 1 in which the rubber hardness of the compression bonding portion was less than 40, a pressure applied to the IC chip was insufficient and therefore the initial conduction resistance and the connection reliability were not good. In Comparative Example 2 in which the rubber hardness of the compression bonding portion was more than 80, the pressure applied to the fillet portion was insufficient, a void was generated in the binding resin of the adhesive, and the connection reliability was not good.

In Example 3 in which the melting viscosity of the binding resin of the anisotropic conductive adhesive film was $1.0 \times 10^2$ mPa·s and Example 1 in which the melting viscosity of the binding resin of the anisotropic conductive adhesive film was $1.0 \times 10^5$ mPa·s, both the initial conduction resistance and the connection reliability were good and no void was generated.

On the other hand, in Comparative Example 3 which used the binding resin having the melting viscosity less than $1.0 \times 10^2$ mPa·s, the binding resin had large fluidity during thermocompression bonding and a void was generated. Thus, the initial conduction resistance and the connection reliability were not good. In Comparative Example 4 which used the binding resin having the melting viscosity larger than $1.0 \times 10^5$ mPa·s, the binding resin could not be completely removed from the connecting portion during thermocompression bonding and a void was generated. Thus, the initial conduction resistance and the connection reliability ere not good.

Moreover, in Comparative Example 5 which used the compression bonding portion that was thinner than the IC chip, no pressure was applied to the fillet portion and a void was generated. Thus, the initial conduction resistance and the connection reliability were not good.

The present invention can be applied in any suitable manner. For example, the present invention can be used in an application in which an electric and electronic component such as a semiconductor chip is mounted onto a printed wiring board so as to fabricate a circuit board during manufacturing of compact electronic equipment.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A mounting device for mounting and electric component on a wiring board, the mounting device comprising:
   a thermocompression bonding head having a compression bonding portion formed of an elastomer in solid form having rubber hardness that ranges from about 40 to about 80,
   wherein the compression bonding portion is configured to be pressed against an electric component placed on a wiring board such that a side region of the electric component is pressed with a side region pressure smaller than a pressure applied to the top region.

2. The mounting device according to claim 1, wherein a thickness of the compression bonding portion of the thermocompression bonding head is equal to or larger than a thickness of the electric component.

3. The mounting device according to claim 1, wherein a size of the compression bonding portion of the thermocompression bonding head is larger than an area of the electric component placed on the wiring board.

4. The mounting device according to claim 1, wherein a size of the compression bonding portion of the thermocompression bonding head is larger than an area of a region where a plurality of electric components are arranged.

5. The mounting device according to claim 1, further comprising a base for supporting the wiring board, wherein the base includes a heater.

6. The mounting device according to claim 1, wherein the thermocompression bonding head is configured to directly contact the top surface and the side surfaces of the electronic component when the thermocompression bonding head is pressed against the electric component.

7. The mounting device according to claim 1, wherein the thermocompression bonding head has a head body comprised of a predetermined metal and includes a heater.

8. The mounting device according to claim 7, wherein a concave portion is formed in a portion of the head body that is opposed to the base, and the compression bonding portion is attached to the concave portion to be in close contact with the concave portion.

9. A mounting system for mounting an electric component on a wiring board, the system comprising:
   a thermocompression bonding head having a compression bonding portion formed of an elastomer in solid form having rubber hardness that ranges from about 40 to about 80; and
   a base member positioned apart from the thermocompression bonding head and configured to support the wiring board and the electric component between the base member and the compression bonding portion,
   wherein the compression bonding portion is configured to be pressed against the electric component placed on the wiring board with a predetermined pressure wherein the thermocompression bonding head is configured to apply a higher pressure to the top surface of the electronic component and a lower pressure to the side surfaces of the electronic component.

10. The mounting system according to the claim 9, wherein a thickness of the compression bonding portion of the thermocompression bonding head is equal to or larger than a thickness of the electric component.

11. The mounting system according to claim 9, wherein a size of the compression bonding portion of the thermocompression bonding head is larger than an area of the electric component placed on the wiring board.

12. The mounting system according to claim 9, wherein a size of the compression bonding portion of the thermocompression bonding head is larger than an area of a region where a plurality of electric components are arranged.

13. The mounting system according to claim 9, wherein the base includes a heater.

14. The mounting system according to claim 9, wherein the electric component includes a top surface and side surfaces, and wherein the thermocompression bonding head is configured to directly contact the top surface and the side surfaces of the electronic component when the thermocompression bonding head is pressed against the electric component.

* * * * *